(12) United States Patent
Bowman et al.

(10) Patent No.: US 9,051,516 B2
(45) Date of Patent: *Jun. 9, 2015

(54) MELT STABILIZATION AND VAPOR-PHASE SYNTHESIS OF CESIUM GERMANIUM HALIDES

(71) Applicant: The United States of America, as represented by the Secretary of the Navy, Washington, DC (US)

(72) Inventors: Steven R. Bowman, Edgewater, MD (US); Nicholas J. Condon, Silver Spring, MD (US); Shawn P. O'Connor, Dunkirk, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/577,711

(22) Filed: Dec. 19, 2014

(65) Prior Publication Data

US 2015/0123034 A1 May 7, 2015

Related U.S. Application Data

(63) Continuation of application No. 13/675,890, filed on Nov. 13, 2012, now Pat. No. 8,945,418.

(60) Provisional application No. 61/560,515, filed on Nov. 16, 2011.

(51) Int. Cl.
| | |
|---|---|
| *C01D 3/04* | (2006.01) |
| *C09K 11/66* | (2006.01) |
| *C30B 11/02* | (2006.01) |
| *C30B 29/12* | (2006.01) |
| *C01G 17/04* | (2006.01) |

(52) U.S. Cl.
CPC ............... *C09K 11/665* (2013.01); *C30B 11/02* (2013.01); *C30B 29/12* (2013.01); *C01G 17/04* (2013.01)

(58) Field of Classification Search
CPC .................................. C01D 3/04; C01G 17/04
USPC ...................................................... 252/182.33
See application file for complete search history.

(56) References Cited

U.S. PATENT DOCUMENTS

| | | | | |
|---|---|---|---|---|
| 4,194,807 | A * | 3/1980 | Gliemeroth | 385/124 |
| 4,776,868 | A * | 10/1988 | Trotter et al. | 65/17.4 |
| 6,815,014 | B2 * | 11/2004 | Gabelnick et al. | 427/488 |
| 8,043,980 | B2 * | 10/2011 | Kouvetakis et al. | 438/786 |
| 2002/0177244 | A1 * | 11/2002 | Hsu et al. | 438/3 |
| 2003/0176734 | A1 * | 9/2003 | Chaturvedi et al. | 562/547 |
| 2005/0082624 | A1 * | 4/2005 | Gousev et al. | 257/410 |
| 2006/0078679 | A1 * | 4/2006 | Elers et al. | 427/248.1 |
| 2007/0074541 | A1 * | 4/2007 | Badding et al. | 65/413 |
| 2009/0029530 | A1 * | 1/2009 | Kunii | 438/478 |
| 2009/0087496 | A1 * | 4/2009 | Katusic et al. | 424/639 |
| 2009/0137103 | A1 * | 5/2009 | Yamazaki | 438/479 |
| 2010/0183818 | A1 * | 7/2010 | Hwang et al. | 427/475 |

* cited by examiner

*Primary Examiner* — Nicole M Buie-Hatcher
*Assistant Examiner* — M. Reza Asdjodi
(74) *Attorney, Agent, or Firm* — US Naval Research Laboratory; Stephen T. Hunnius

(57) ABSTRACT

The method described herein allows for melt stabilization and vapor-phase synthesis of a cesium germanium halide utilizing germanium dihalides formed in situ. This disclosure allows for the melting of cesium germanium halides without decomposition, which allows for growing crystals of these materials from the melt. This disclosure allows for a direct synthesis of these materials without the use of water or the introduction of other possible contaminants.

12 Claims, 5 Drawing Sheets

MELT STABILIZATION AND VAPOR-PHASE SYNTHESIS OF CESIUM GERMANIUM HALIDES

CROSS-REFERENCE TO RELATED APPLICATIONS

This application claims priority to and benefits of U.S. patent application Ser. No. 13/675,890 filed on Nov. 13, 2012 which is a non-provisional of and claims priority to U.S. Patent Application No. 61/560,515 filed Nov. 16, 2011, both of which are herein incorporated by reference in the entirety.

BACKGROUND OF THE INVENTION (1) Field of the Invention

The method disclosed herein allows for the melting of cesium germanium halides without decomposition and a direct synthesis without the introduction of possible contaminants.

(2) Description of Related Art

Cesium germanium halides are a highly promising class of material for the nonlinear optical frequency conversion of laser sources. These materials promise unique capabilites for conversion from the visible to the far-infrared, with the possibility of periodic poling.

Nonlinear Optical Frequency Conversion

Nonlinear optical (NLO) frequency conversion techniques allow the wavelengths of laser sources to be changed to fit a given application. In all such techniques, the light from a pump laser is passed through an NLO material and nonlinearities in the interaction of the laser with the material give rise to new optical frequencies.

Common examples of NLO frequency converters include second-harmonic generation (SHG) and optical parametric oscillation (OPO), the latter of which is illustrated in FIG. 1.

Pump light at a frequency, $\omega_P$ ($\omega=2\pi c/n\lambda$, where c is the speed of light and n is the refractive index), is brought into an optical cavity enclosing an NLO crystal. Light is generated at two new frequencies, the signal, $\omega_S$ and the idler, $\omega_I$, where, by convention, $\omega_S > \omega_I$. The cavity is generally designed to confine and oscillate one or more of the three frequencies involved. The NLO conversion process must satisfy conservation of energy:

$$\omega_P = \omega_S + \omega_I \quad (1)$$

The process must also satisfy conservation of momentum, or phasematching. Traditional phasematching methods require satisfying Eq. 2:

$$k_P = k_S - k_I \quad (2)$$

where $k_P$, $k_S$, and $k_I$ are the wavevectors of the pump, signal, and idler respectively:

$$k = n\omega/c \quad (3)$$

As the indices of refraction of a material generally vary with frequency, the condition in Equation 2 is generally met by adjusting the polarizations of the three fields with respect to the optical axes of a birefringent crystal.

The efficiency of this conversion process ($\eta$) depends on the length of interaction (L), the input power (P), and the effective nonlinear coefficient of the crystal ($d_{eff}$):

$$\eta \propto d_{eff}^2 LP \operatorname{sinc}\left(\frac{\Delta kL}{2}\right) \quad (4)$$

where $\Delta k$ is the phase mismatch:

$$\Delta k = k_P - k_S - k_I \quad (5)$$

$$\operatorname{sinc}(x) = \frac{\sin(x)}{x} \quad (6)$$

So, increasing the effective nonlinear coefficient greatly increases the conversion efficiency at a given power, while increasing the pathlength increases the power at the expense of increasing the sensitivity to deviations from perfect phase-matching. Birefringent walkoff, where the extraordinary ray propagates in a slightly different direction than the ordinary ray, often limits achievable interaction lengths. The dependence on pump power means that high peak power pump sources, such as Q-switched or mode-locked lasers, are often preferred over CW pumps.

Nonlinear Optical Materials

The key component of a nonlinear optical frequency converter is the NLO material. As most technologically significant NLO frequency conversion methods are based on three wave mixing processes, good NLO materials must possess a large second-order optical nonlinear susceptibility, or $\chi^{(2)}$, where $d_{eff} = \chi^{(2)}/2$. For $\chi^{(2)}$ to be greater than zero, the material must not possess inversion symmetry; this limitation severely limits the number of available materials. A good NLO material must also be transparent at all of the wavelengths involved in the conversion process, as robust as possible, and have a high damage threshold. It must be possible to phase match the desired process, so the material must either be sufficiently birefringent or made into a periodically-poled structure. Finally, the material should be as environmentally stable and robust as possible.

There are two broad classes of nonlinear optical material currently used in frequency conversion applications: oxides and semiconductors. The oxides include such common materials as potassium titanyl phosphate (KTiOPO$_4$, or KTP), β-barium borate (β-BaB$_2$O$_4$, or BBO), and lithium niobate (LiNbO$_3$). These materials are generally transparent in the visible and the near infrared (to ~3 μm), and can be pumped with readily-available laser sources, such as Nd:YAG, near 1 μm. They can be birefringently phase matched over a large range, and periodic poling has been demonstrated in KTiOPO$_4$ (PPKTP) and LiNbO$_3$ (PPLN). PPLN has been a particularly successful material, finding use in many applications and enabling high-efficiency CW OPO designs.

The latter class, semiconductors, includes primarily materials developed for use in the mid-infrared at wavelengths longer than 1.5 μm, such as zinc germanium phosphide (ZnGeP$_2$, or ZGP) and silver gallium selenide (AgGaSe$_2$). Due to significant absorption in the visible and near-infrared, none of these materials are compatible in practice with 1 μm pump sources.

The cesium germanium halides (CsGeX$_3$, for X=Cl, Br, I) are an emerging class of NLO materials that hold the promise of replacing both oxide and semiconductor materials in many applications. Though they were first synthesized many years ago, it is primarily since the publication of an improved synthesis and a patent on their use as nonlinear optical materials in 1998 that they have come to the attention of the nonlinear optics community.

Reports on powders have shown that they are transparent from the visible through the far-infrared, with no absorbing regions in between, and that they can be phase matched for frequency doubling of 1 μm lasers. They have also demonstrated high nonlinear coefficients ($d_{eff}$ of ~10 pm/V for CsGeBr$_3$, compared with ~4 pm/V for KTP), with evidence for the ability to birefringently phasematch the frequency doubling of lasers with wavelengths around 1 μm.

Solution Synthesis of CsGeCl$_3$ and CsGeBr$_3$

All published methods for the synthesis of CsGeCl$_3$ and CsGeBr$_3$ are carried out in aqueous solutions. The typical reaction used involves the reduction of Ge(IV) to Ge(II) by an excess of hypophosphorous acid:

$$H_3PO_2 + 2GeO_2 + 4HX + 2CsX \rightarrow 2CsGeX_3 + 2H_2O + H_3PO_4 \quad (7)$$

where X=Cl or Br.

This reaction is effective in generating the desired CGX, but it can leave behind residual reactants or products, and drying the CGX by conventional methods may not remove the residual water. An infrared spectrum of CsGeCl$_3$ produced by this method is shown in FIG. 2. There are multiple spectral features present, including the phosphorous-oxygen feature at ~1100 cm$^{-1}$ and hydrogen-oxygen feature at ~3500 cm$^{-1}$. In pure CsGeCl$_3$, there would be no absorption features at all in this region. These contaminants pose a real problem for the use of CGX compounds in practical nonlinear conversion systems, such as OPOs, as their absorption features will preclude proper production of many useful infrared wavelengths.

Thus, it is critical that uncontaminated material be produced. Purification by recrystallization (dissolving the compound in a minimal amount of hot solvent, then letting the solvent cool) has the potential to remove many of the contaminants, but residual water will continue to be a problem.

Melt Stability of CsGeCl$_3$ and CsGeBr$_3$

As mentioned above, the solution synthesis route to CsGeX$_3$ generally produces material that is contaminated with water. To remove this water, it would be desirable to purify the material via directional solidification (whereby a charge is melted and solidified slowly from one end to the other and the contaminated material that solidifies last is discarded) or zone refining. A stable melt is also required for growing single crystals from the melt.

While both cesium germanium chloride and cesium germanium bromide can be melted (with both melting around 355° C.), they have issues with decomposition due to the relative instability of Ge(II) oxidation state compared to Ge(0) and Ge(IV). If they are melted under vacuum, under an inert atmosphere, or under GeX$_4$, they can decompose with reduction of the Ge(II) and release of halogen gas:

$$CsGeX_3 \rightarrow CsX + Ge(0) + X_2 \quad (8)$$

They can also disproportionate:

$$2CsGeX_3 \rightarrow 2CsX + Ge(0) + GeX_4 \quad (9)$$

If, instead of vacuum or an inert atmosphere, the halogen is used as a cover gas, then the Ge(II) can oxidize to Ge(IV):

$$CsGeX_3 + X_2 \rightarrow CsX + GeX_4 \quad (10)$$

Evidence for all of these processes have been observed for X=Cl. Under high-pressure (above 100 torr) atmospheres of Cl$_2$, condensation of GeCl$_4$ (indicating the action of the latter reaction, above) was evident. Under vacuum, lower-pressure Cl$_2$, argon, or GeCl$_4$ atmospheres, the formation of black particles was observed in the melt, indicating the presence of Ge(0) and the action of one or both of the former reactions.

BRIEF SUMMARY OF THE INVENTION

The method described herein allows for the melting of cesium germanium halides without decomposition, as would be needed to grow crystals of these materials from the melt. In addition, it offers a direct synthesis of these materials without the use of water or the introduction of other possible contaminants.

DETAILED DESCRIPTION OF THE INVENTION

Methods and Apparatus

In order to inhibit the decomposition of the cesium germanium halides, we have developed the technique of using germanium dihalides (GeCl$_2$ and GeBr$_2$) as the cover gases. In addition, the use of these gases allows for the direct, gas-phase synthesis of cesium germanium halides.

Germanium dihalides are not generally stable enough for long-term storage, so they need to be made in situ. At high temperatures, this can be done by reacting Ge(0) with GeX$_4$ vapor:

$$Ge(0) + GeX_4 \rightarrow 2GeX_2 \quad (11)$$

The neutral germanium reduces the Ge(IV) in the tetrahalide to Ge(II), picking up the two leftover halide ions to make two equivalents of GeX$_2$. The GeX$_2$ gas itself is nonreactive with CsGeX$_3$, as it has the same oxidation state. It will, however, react with CsX to produce CsGeX$_3$:

$$CsX + GeX_2 \rightarrow CsGeX_3 \quad (12)$$

Thus, if the CsGeX$_3$ begins to decompose, the presence of GeX$_2$ vapor will recompose it.

Figure 1:
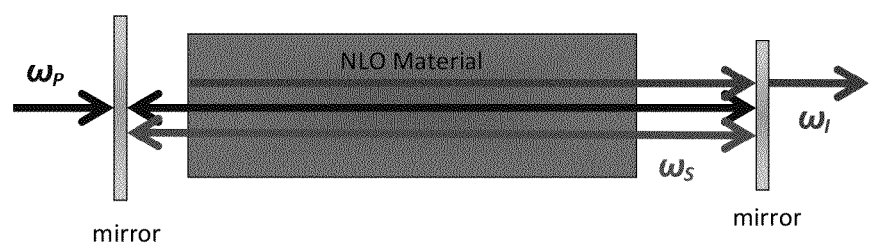
FIG. 1 illustrates an optical parametric oscillator (OPO) where the pump and signal are resonant and the idler is transmitted.
Figure 2:
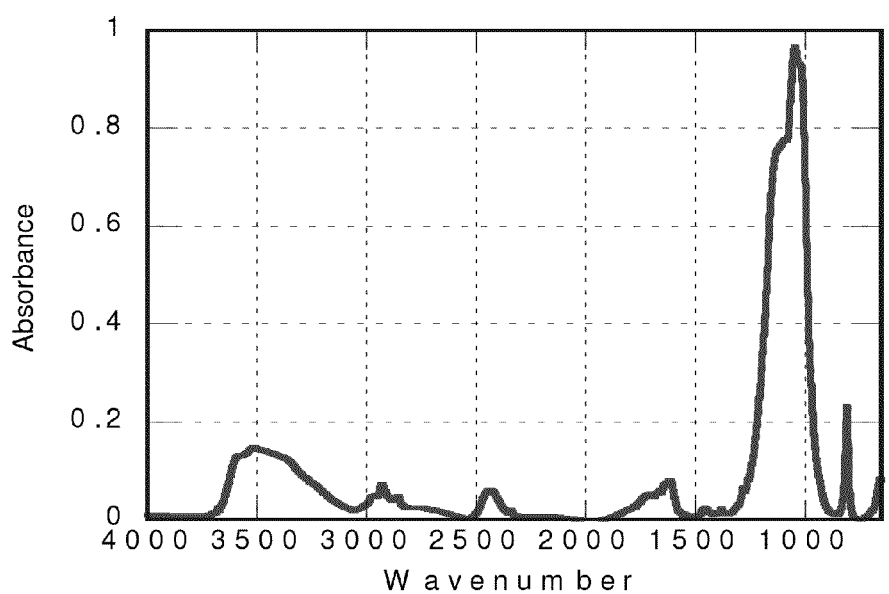
FIG. 2 illustrates infrared absorption spectrum of a pressed pellet of wet-synthesized CsGeCl$_3$.
Figure 3:
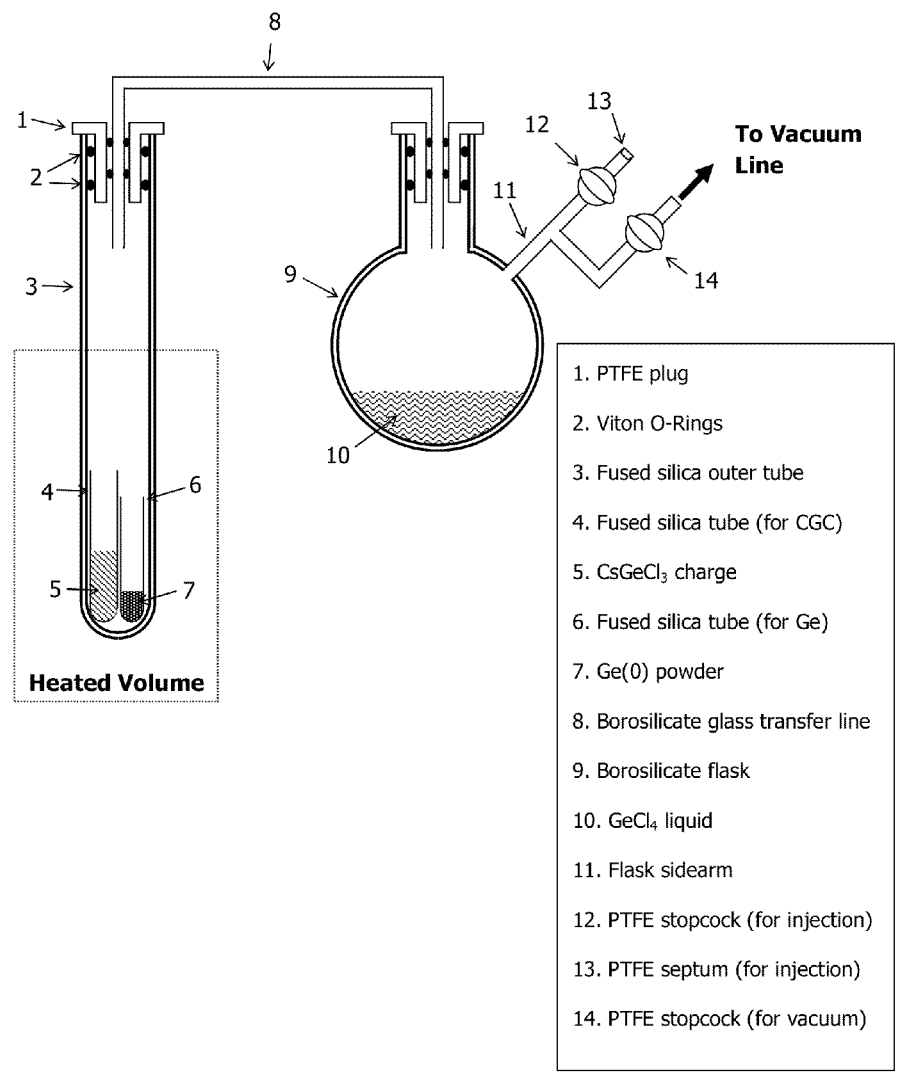
FIG. 3 illustrates a diagram of an apparatus for melting of CsGeCl$_3$ under GeCl$_2$.

An apparatus to carry out melting of CGX under GeX$_2$ utilizes four basic components: an ampoule of CGX, an ampoule of Ge(0), a room-temperature reservoir of GeX$_4$, and an enclosure that allows all of these things to share an atmosphere. A typical apparatus shown for the in situ generation of GeCl$_2$ to stabilize a melt of CGC is shown in FIG. 3. The purpose of melting the CGC here is to purify it by directional solidification, but analogous arrangements may be used for single crystal growth as well.

Example 1

A charge of CGC 5 (~10 g) is loaded into one round-bottomed fused silica tube 4, while a charge of Ge(0) 7 (~1 g) is loaded into another round-bottomed tube (6). Both tubes are then loaded into a larger fused silica outer vessel 3, which is capped with a PTFE plug 1 that is sealed with Viton o-rings 2. A borosilicate glass transfer tube 8 is fit into this plug, again with Viton o-rings, and a similar plug arrangement is fit to the other side of the transfer tube. This plug is inserted in a borosilicate flask 9 with a sidearm 11. The sidearm is split into two arms, one for the injection of GeCl$_4$ 10 (which is not present in the flask upon setup) and the other for attachment to a vacuum system. The injection arm features a PTFE stopcock 12 and is capped with a PTFE septum 13 that allows for the insertion of a needle. The vacuum arm also has a PTFE stopcock 14.

After loading, the tube end of the apparatus is placed in a vertical tube furnace such that the two glass ampoules it contains 4,6 are completely within the heated volume. The system is evacuated for several hours to remove the room air and any residual water that may be present, then ~5 g of $GeCl_4$ 10 is injected into the flask 9 using a syringe with a needle that is pushed through the PTFE septum [13]. Very soon after injection, both PTFE stopcocks 12,14 are closed, leaving the $GeCl_4$ to boil and fill the enclosed volume to its vapor pressure (about 200 torr at 293 K). Once the atmosphere is established, the temperature of the furnace is brought up to 360° C. to melt the CGC. At this temperature, the $GeCl_4$ will react with the Ge(0) to generate the desired $GeCl_2$ gas.

Example 2

Figure 4:
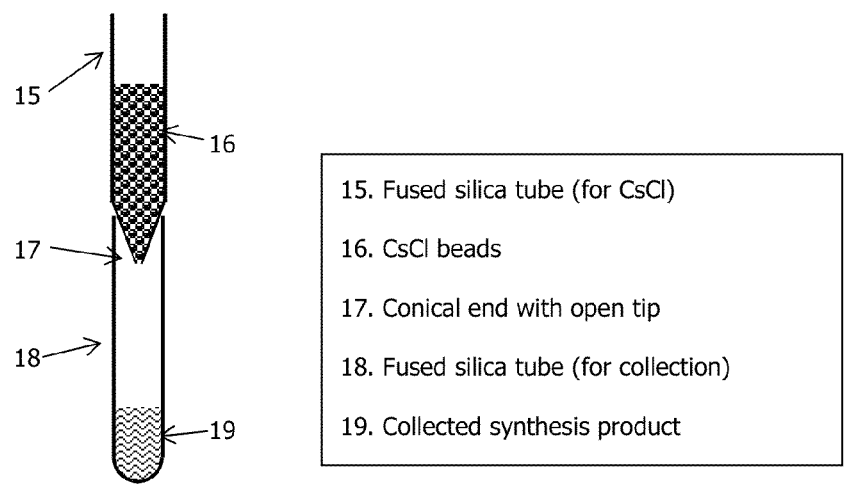
FIG. 4 illustrates modified tubes for dry CGC synthesis.

The reaction Eq. 12 offers the possibility of direct, vapor-phase synthesis of $CsGeX_3$. This produces material that has never been exposed to water, reducing or eliminating the need for further purification. To implement this synthesis, the glass ampoule 4 containing the CGC charge in the apparatus of FIG. 3 is replaced with the apparatus shown in FIG. 4 while leaving the other components intact. First the round-bottomed fused silica collection tube 18 is loaded into the outer tube 3. Then cesium chloride beads 16 (–30 mesh) are loaded into a tube 15 with a conical end and open tip 17 and the tip is placed in the open mouth of the collection tube 18, which has a notch on its top rim to allow free gas passage in the assembled configuration. The assembly and operation proceeds much as before, and when the furnace is brought to 360° C., the $GeCl_2$ will begin to react with the CsCl beads to form $CsGeCl_3$. As it is formed, the product will run off the beads 16 and drip into the collection tube 18. This process will help keep the CsCl surfaces exposed so they can react with further $GeCl_2$.

Figure 5:
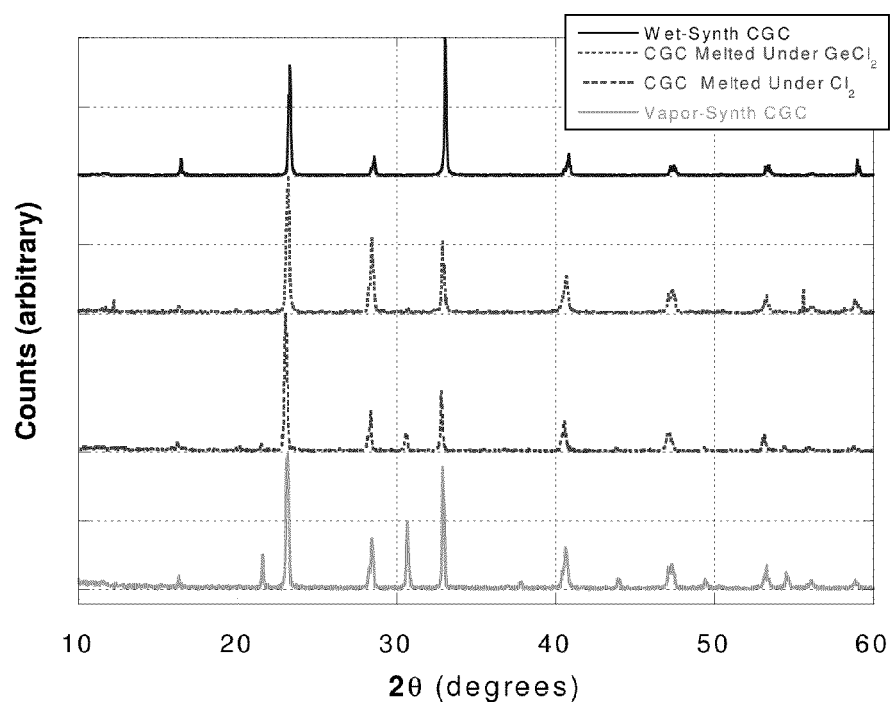
FIG. 5 illustrates XRD results from four CGC samples.

To analyze the success of these procedures, powder x-ray diffraction (XRD) measurements were taken of four samples: wet-synthesized CGC, CGC melted under $GeCl_2$ using the procedures outlined above, CGC melted under ~25 torr of $Cl_2$, and the material collected from a vapor-phase synthesis run. The data from these measurements are shown in FIG. 5. The top data set, of the wet-synthesized CGC, shows the same peaks that are present in the literature data and no extraneous peaks. The data set for the CGC melted under $GeCl_2$, in addition to displaying some relative peak height variation that was likely the result of variations in sample preparation, shows peaks at the same positions as the unmelted material. It also shows a tiny additional peak at 30.5°, which indicates the presence of a trace amount of CsCl. The next data set, for CGC melted under $Cl_2$, shows a much more intense peak at 30.5°, as well as new peaks at 21.5° and 54.5°, indicating the presence of a larger amount of CsCl. The final, lowermost data set, taken on the product of a CGC vapor-phase synthesis, indicates that the sample is CGC with even more CsCl. A melting point measurement of the latter material, when compared to a fraction of the CGC-CsCl phase diagram, indicated that it is composed of 85% CGC, 15% CsCl.

These results indicate that these methods are already successful in their aims. The significantly reduced quantity of CsCl in the CGC that was melted under $GeCl_2$ compared to that which was melted under $Cl_2$ indicates a significant improvement in the stability of the melt. The results from the vapor-phase synthesis run show unequivocal production of CGC.

Currently, the only growth method for cesium germanium halide crystals is a growth from an aqueous solution. This yields very small crystals, and water contamination, which seriously impairs their utility as nonlinear optical materials, is unavoidable. The methods presented here allow cesium germanium halides to be melted without decomposition, enabling the melt growth of single crystals of these materials. In addition, these methods allow the production of cesium germanium halides without any use of aqueous solutions, allowing for a much higher potential purity and a concomitant increase in the usefulness of the result material.

As described above, this method may be used for melt stabilization and vapor-phase synthesis of both cesium germanium chloride ($CsGeCl_3$) and cesium germanium bromide ($CsGeBr_3$).

The above description is that of a preferred embodiment of the invention. Various modifications and variations are possible in light of the above teachings. It is therefore to be understood that, within the scope of the appended claims, the invention may be practiced otherwise than as specifically described. Any reference to claim elements in the singular, e.g., using the articles "a," "an," "the," or "said" is not construed as limiting the element to the singular.

What we claim is:

1. A method of vapor-phase synthesis of a cesium germanium halide, comprising:
   utilizing germanium dihalides as cover gases in a first vessel;
   reacting Ge metal with $GeX_4$ vapor and producing germanium dihalide vapor in situ in the first vessel;
   transporting the germanium dihalide vapor to a second vessel;
   reacting the germanium dihalide vapor with CsX in the second vessel; and
   producing $CsGeX_3$ in the second vessel.

2. The method of vapor-phase synthesis of a cesium germanium halide of claim 1 wherein the reaction is not exposed to water.

3. The method of vapor-phase synthesis of a cesium germanium halide of claim 2 further including:
   decomposing $GeX_4$ and Ge metal to form products of decomposition;
   reacting the products of decomposition with CsX; and
   forming $CsGeX_3$ in situ.

4. The method of vapor-phase synthesis of a cesium germanium halide of claim 1 wherein the halogen is one selected from the group consisting of chlorine, bromine, and iodine.

5. A method of vapor-phase synthesis of a cesium germanium halide comprising:
   loading a charge of CsX into a first tube;
   loading a charge of Ge(0) into a second tube;
   loading the first tube and the second tube into a first vessel;
   capping the vessel with a plug and thereby sealing;
   fitting a transfer tube into the plug;
   placing the first vessel with the first tube and the second tube into a furnace;
   evacuating and removing the room air and any water;
   injecting $GeCl_4$ into the first vessel;
   boiling the $GeCl_4$;
   filling the vessel to its vapor pressure;
   increasing the temperature of the furnace to about 360 degrees C.;
   reacting the $GeCl_4$ with the Ge(0) and generating $GeCl_2$ gas in the first vessel;

transporting the $GeCl_2$ gas to a second vessel; and
reacting the $GeCl_2$ gas with CsX and producing $CsGeX_3$.

6. The method of vapor-phase synthesis of a cesium germanium halide of claim 5
wherein the charge of CsX is about 10 g; and
wherein the charge of Ge(0) is about 1 g.

7. The method of vapor-phase synthesis of a cesium germanium halide of claim 6 wherein the $GeCl_4$ is about 5 g.

8. The method of vapor-phase synthesis of a cesium germanium halide of claim 7 wherein the $GeCl_4$ vapor pressure is about 200 torr at 293K.

9. A method of vapor-phase synthesis of a cesium germanium halide comprising:
loading a charge of CsCl beads into a first tube with an opening;
placing a third tube near the opening for collecting the product;
loading a charge of Ge(0) into a second tube;
loading the first tube and the second tube into a first vessel;
capping the first vessel with a plug and thereby sealing;
placing the first vessel with the first tube and the second tube into a furnace;
evacuating and removing the room air and any water;
injecting $GeCl_4$ into the first vessel;
boiling the $GeCl_4$;
filling the first vessel to its vapor pressure;
increasing the temperature of the furnace to about 360 degrees C.;
reacting the $GeCl_4$ with the Ge(0) and generating $GeCl_2$ gas;
transporting the $GeCl_2$ gas to a second vessel;
reacting the $GeCl_2$ gas with CsCl beads; and
producing $CsGeX_3$ in the second vessel.

10. The method of vapor-phase synthesis of a cesium germanium halide of claim 9 wherein the cesium chloride beads have a particle size of about −30 mesh.

11. The method of vapor-phase synthesis of a cesium germanium halide of claim 10
wherein the charge of Ge(0) is about 1 g;
wherein the $GeCl_4$ is about 5 g; and
wherein the $GeCl_4$ vapor pressure is about 200 torr at 293K.

12. The method of vapor-phase synthesis of a cesium germanium halide of claim 10 wherein the reaction is not exposed to water.

* * * * *